United States Patent [19]

Johnsen et al.

[11] 4,414,580

[45] Nov. 8, 1983

[54] PROGRESSIVE TRANSMISSION OF TWO-TONE FACSIMILE

[75] Inventors: Ottar Johnsen, Middletown; Arun N. Netravali, Westfield, both of N.J.

[73] Assignee: Bell Telephone Laboratories, Incorporated, Murray Hill, N.J.

[21] Appl. No.: 268,847

[22] Filed: Jun. 1, 1981

[51] Int. Cl.$^3$ .............................................. H04N 7/12
[52] U.S. Cl. .................................. 358/260; 358/152; 358/263; 358/133
[58] Field of Search ............... 358/263, 133, 260, 261, 358/152; 340/347 DD

[56] References Cited

U.S. PATENT DOCUMENTS

| | | | |
|---|---|---|---|
| 3,116,436 | 12/1963 | Sweeney | 358/152 |
| 4,193,092 | 3/1980 | Stoffel | 358/133 |
| 4,222,076 | 9/1980 | Knowlton | 358/263 |
| 4,254,438 | 3/1981 | Yamazaki et al. | 358/261 |

OTHER PUBLICATIONS

O. Johnsen et al., "An Extension of the CCITT Facsimile Codes for Dither Pictures" The Bell System Technical Journal, vol. 60, No. 3, 3–81, pp. 391–404.
Murat Kunt, "Source Coding of X-Ray Pictures" IEEE Trans. on Biomedical Engr., vol. BME-25, No. 2, Mar. 1978, pp. 121–138.
K. Knowlton, "Progressive Transmission of Gray-Scale and Binary Pictures by Simple, Efficient and Lossless Encoding Schemes" Proceedings of IEEE, vol. 68, No. 7, Jul. 7, 1980, pp. 885–889.
K. R. Sloan, Jr. et al., "Progressive Refinement of Raster Images" IEEE Trans. on Computers, vol. C-28, Nov. 1979, pp. 871–874.
A. J. Frank et al., "Progressive Image Transmission Using a Growth-Geometry Coding" Proceeding of IEEE, vol. 68, No. 7, Jul. 1980, pp. 897–909.
R. Hunter et al., "Int'l Digital Facsimile Coding Standards" Proceeding IEEE, vol. 68, No. 7, Jul. 1980, pp. 854–867.

Primary Examiner—John C. Martin
Assistant Examiner—Edward L. Coles
Attorney, Agent, or Firm—John A. Caccuro

[57] ABSTRACT

A method and apparatus for the transmission of two-tone pictures progressively in several stages. Progressive transmission enables a viewer to receive and utilize pictures in a small fraction of the normal transmission time. In a first stage, information representing groups of picture elements of preselected lines of the scanned picture is transmitted which allows a coarse version of the picture to be reproduced at a receiver. During the subsequent stages the horizontal resolution of the previously transmitted scan lines is improved and additional scan lines are transmitted in a specific order until the received picture is an identical copy of the original picture. The progressive picture information is efficiently transmitted in one of several line-by-line codes resulting in a total transmission time not significantly longer than the time for a nonprogressive transmission.

45 Claims, 7 Drawing Figures

FIG. 4

MESSAGE FORMATS

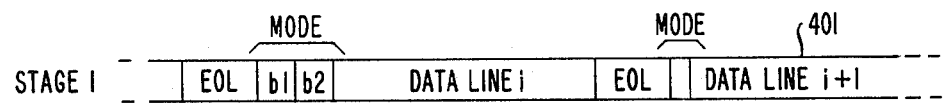

STAGE 1: | EOL | b1 | b2 | DATA LINE i | EOL | | DATA LINE i+1 |  (401)

- b1=0=UNCODED
- b1=1=CODED
- b2=0=1D
- b2=1=2D

STAGES 2,3,5,7: | EOL | b1 | b2 | DATA LINE i | EOL | | DATA LINE i+1 |  (402)

- b1=0=UNCODED
- b1=1=CODED 2D
- b2=0=ABOVE
- b2=1=BELOW

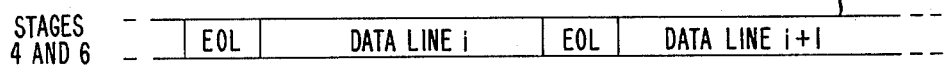

STAGES 4 AND 6: | EOL | DATA LINE i | EOL | DATA LINE i+1 |  (403)

COMPLETE IMAGE MESSAGE FORMAT  (404)

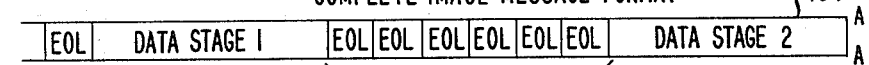

| EOL | DATA STAGE 1 | EOL | EOL | EOL | EOL | EOL | EOL | DATA STAGE 2 |

END OF STAGE

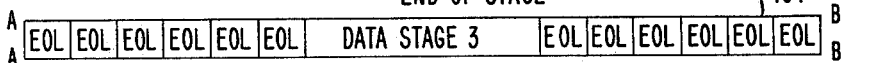

| EOL | EOL | EOL | EOL | EOL | EOL | DATA STAGE 3 | EOL | EOL | EOL | EOL | EOL | EOL |

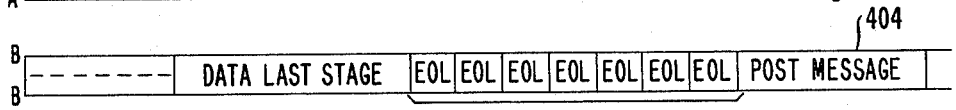

| ------- | DATA LAST STAGE | EOL | EOL | EOL | EOL | EOL | EOL | EOL | POST MESSAGE |

END OF IMAGE

FIG. 5
1  STAGE 1: 1 OF 16 LINES AT 1/4 RESOLUTION
2  STAGE 2: 1 OF 8 LINES AT 1/4 RESOLUTION
3  STAGE 3: 1 OF 4 LINES AT 1/4 RESOLUTION
4  STAGE 4: 1 OF 4 LINES AT 1/2 RESOLUTION
5  STAGE 5: 1 OF 2 LINES AT 1/2 RESOLUTION
6  STAGE 6: 1 OF 2 LINES AT FULL RESOLUTION
7  STAGE 7: ALL LINES AT FULL RESOLUTION

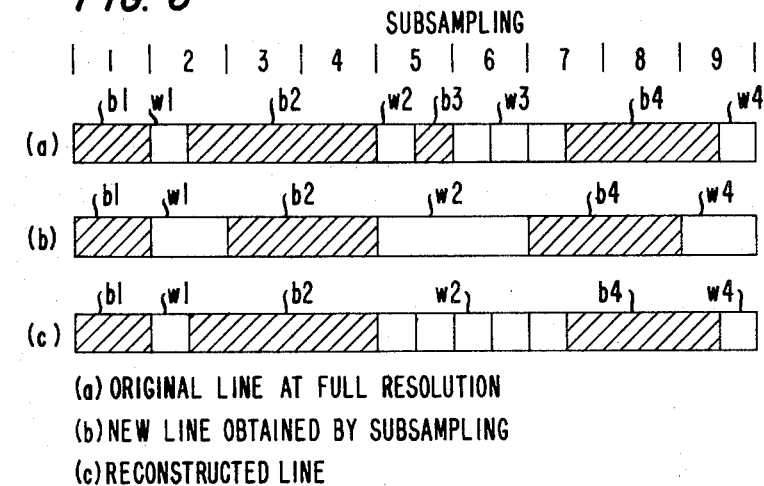
(a) ORIGINAL LINE AT FULL RESOLUTION
(b) NEW LINE OBTAINED BY SUBSAMPLING
(c) RECONSTRUCTED LINE
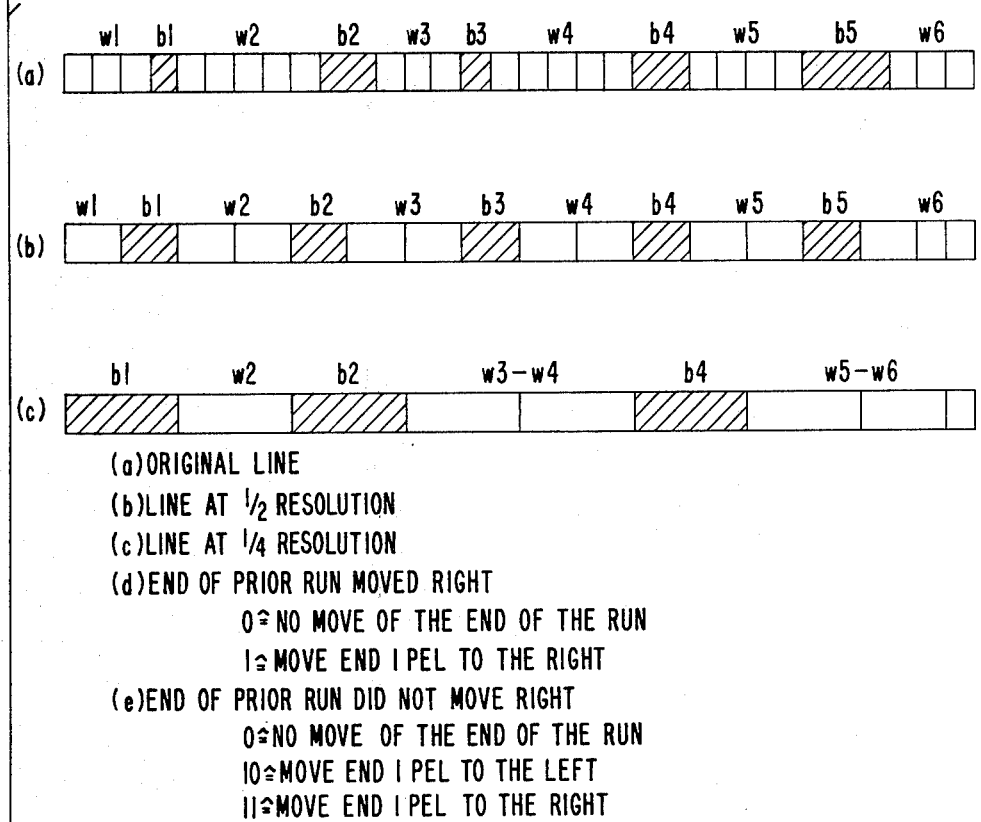
(a) ORIGINAL LINE
(b) LINE AT ½ RESOLUTION
(c) LINE AT ¼ RESOLUTION
(d) END OF PRIOR RUN MOVED RIGHT
  0 ≏ NO MOVE OF THE END OF THE RUN
  1 ≏ MOVE END 1 PEL TO THE RIGHT
(e) END OF PRIOR RUN DID NOT MOVE RIGHT
  0 ≏ NO MOVE OF THE END OF THE RUN
  10 ≏ MOVE END 1 PEL TO THE LEFT
  11 ≏ MOVE END 1 PEL TO THE RIGHT

PROGRESSIVE TRANSMISSION OF TWO-TONE FACSIMILE

FIELD OF THE INVENTION

This invention relates to the transmission of a facsimile image over narrow-band transmission channel in general and, in particular, to the encoding and transmission of two-tone, i.e. binary, facsimile elements to facilitate the display of progressively better approximations of exact facsimile image details at a remote receiver location.

BACKGROUND OF THE INVENTION

Conventional facsimile transmission systems sequentially scan pictures (images) line-by-line, from top to bottom and transmit the information to a receiver having a hard-copy output device which sequentially reproduces the picture in the same manner. When facsimile transmitters and receivers are connected over low capacity transmission channels the transmission of high resolution pictures can take a long time. User interaction in such a transmission environment can be frustrating, especially when the user has to browse through a series of pictures.

The utilization of cathode-ray tube monitors and other soft copy output devices together with frame memories now enable additional capabilities to be added to these facsimile transmission systems. One capability is that modification and updating of the displayed picture is possible and, therefore, it is not necessary to transmit the picture in the usual sequential line-by-line format. Progressive facsimile transmission systems utilize this capability to permit the transmission and display of a coarse version of a picture in a small fraction of the total transmission time. Subsequent transmissions gradually improve the picture quality to that of the original picture. In progressive transmission it is important that the most important preceptual features of the picture be transmitted first and in a compressed form. Additionally, the time required for the transmission of all the progressive transmissions should not be much higher than the time required for a conventional line-by-line transmission.

A paper entitled "Progressive Refinement of Raster Images" (published in the *IEEE Transaction on Computers*, Vol. C-28, No. 11, Nov. 1979) by K. R. Sloan and S. L. Tanimoto reviews several progressive image transmission techniques which use a pyramidal data structure. Those pyramidal data transmission techniques send successive levels of signals representing successively smaller arrays of picture elements. In U.S. Pat. No. 4,222,076, issued on Sept. 9, 1980 to K. C. Knowlton and entitled "Progressive Image Transmission", another pyramidal data structure technique is disclosed. A paper entitled "Progressive Image Transmission Using a Growth-Geometry Coding" (published in the *Proceedings of the IEEE*, Vol. 68, No. 7, July 1980) by A. J. Frank, J. D. Daniels and D. R. Unangst describes a growth-geometry coding technique for progressive image transmission.

While equipments utilizing the above techniques are efficient, they are incompatible with the line-by-line codes which have been proposed as the standard for conventional digital facsimile transmission over the general switched telephone network. Currently, line-by-line codes such as the one dimensional (1D) run length code called the "Modified Huffman Code" (MHC) and the two-dimensional (2D) extention of the MHC called the "Modified READ Code" (MRC) are proposed as candidates for the standard code. The paper entitled "International Digital Facsimile Coding Standards" (published in the *Proceedings of the IEEE*, Vol. 68, No. 7, July 1980) by R. Hunter and A. H. Robinson describes the MHC (1D) and MRC (2D) codes which description is incorporated herein by reference. However, as noted previously, the use of these line-by-line codes in a top to bottom sequentially scanned facsimile system is undesirably slow for use with low capacity transmission channels.

The art is lacking an efficient progressive transmission technique which utilizes the above line-by-line codes to encode the picture information for transmission over low capacity channels.

SUMMARY OF THE INVENTION

According to the method and apparatus of this invention, at a transmitting terminal an image or picture is scanned and individual picture element signals are stored in an addressable memory. A transmission processor successively transmits the signals in stages. Each stage consists of preselected nonsuccessive scan lines of the picture. Each line is coded in a line-by-line code representing groups of picture elements of the line. During successive stages of transmission the horizontal resolution of the previously transmitted lines is doubled by sending supplementary line signals for each of the previously transmitted lines while the vertical resolution is doubled by sending additional preselected nonsuccessive scan lines at the increased horizontal resolution. The doubling of the horizontal and vertical resolution continues in successive stages until either each line of the scanned picture has been transmitted at full horizontal resolution to the receiver location or a signal to stop transmission is received from the received location.

At a receiver location the signals are received and a picture displayed progressively from a coarse to a finer picture as the successive stages of signals are received.

In another aspect of the invention, at the transmitting terminal two or more separately identifiable signal representations are made of each preselected scan line during each stage. Thereafter, the transmitting terminal selects and transmits the signal representation which minimizes the transmission time for each line. Correspondingly, at the receiver location the identifying characteristic is determined and the received signal appropriately decoded and displayed.

When sufficient resolution of the transmitted picture has been received, signal transmission can be stopped at an intermediate stage. If transmission is continued to the last stage the final picture is a complete reproduction of the original picture with a total progressive transmission time which is not substantially longer than for a nonprogressive picture transmission.

BRIEF DESCRIPTION OF THE DRAWING

The detailed description of the invention will be more fully appreciated from the illustrative embodiment shown in the drawings, in which:

FIG. 4 shows the various message formats utilized by the system;

FIG. 5 shows the resolution of a picture after each stage of the progressive transmission;

FIG. 6 shows the subsampling of a typical group of picture elements; and

FIG. 7 shows the subsampling of a group of picture elements and the coding utilized to restore the picture resolution.

GENERAL DESCRIPTION

While the disclosed invention is described for use in a black-white progressive picture transmission system the invention can also be easily modified to progressively transmit pictures having pels which have multi-level values. Those aspects of the description which are not applicable to multi-level pictures will be pointed out in the following description.

Figure 1:
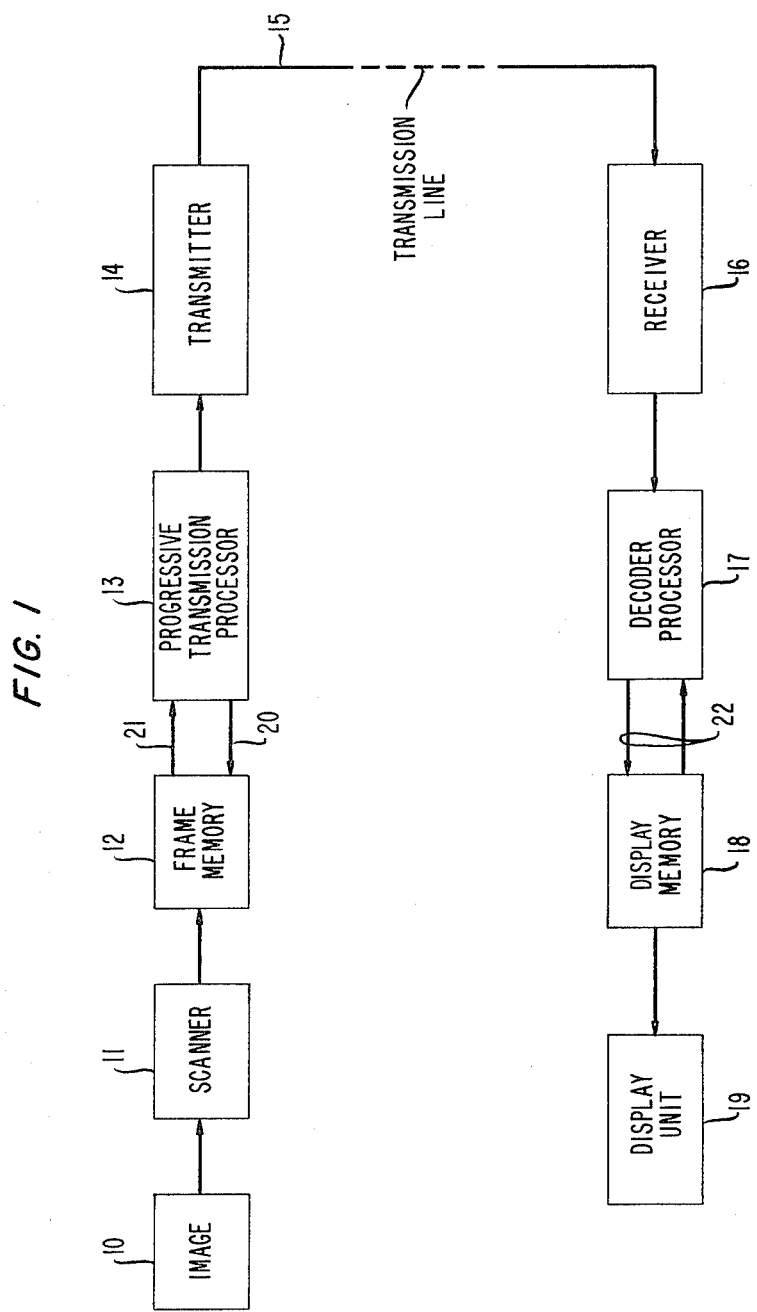
FIG. 1 shows an overall block diagram of a progressive facsimile transmission system.

FIG. 1 is an overall block diagram of the disclosed progressive facsimile transmission system. The system includes scanner 11, frame memory 12, transmission processor 13, transmitter 14, transmission line 15, receiver 16, decoder processor 17, display memory 18 and video display unit 19.

Scanner 11 provides, in a well known manner, an arrangement for scanning image 10 (picture, facsimile, etc.) in a line-by-line fashion from the top to the bottom of the image page (or frame). Scanner 11 outputs two-tone (binary) brightness signals representing the brightness of picture elements (pels) of the image to frame memory 12. Frame memory 12 includes well known arrangements of random access memory (RAM) for storing the binary signal for each pel. Illustratively, transmission processor 13 and frame memory 12 interactively generate signals, according to the principle of this invention which will be described in later paragraphs, for groups of pels which are encoded on a line-by-line basis in one of several codes. The resulting processed or coded signals are stored via lead 20 in frame memory 12 for subsequent outputting in a preselected order to transmitter 14.

It is to be noted that the disclosed invention is not limited to a certain mode of operation between scanner 11, frame memory 12 and transmission processor 13. Thus, transmission processor 13 can also generate the coded signals concurrently with the scanning process and store the coded signal in frame memory 12 for subsequent transmission. The particular operation of scanner 11, frame memory 12 and transmission processor 13 takes place at the normal rapid scanning and computing speeds. The transmission processor 13 can be implemented by any of the well known microprocessors, minicomputers, etc., which is programmed to perform the functions described in the flow chart of FIG. 2 and in the detailed description. In such arrangements, the processed data from transmission processor 13 is fitted by transmitter 14 to the transmission characteristics of transmission line 15, whether by amplitude, frequency, phase or time modulation.

At receiver 16 the modulated digits encoding the image information being transmitted are restored to a baseband signal by appropriate conventional means. Decoder processor 17 then operates on the restored bits, in a manner to be described in later paragraphs, to reconstruct a binary beam intensity pattern for display unit 19 through the medium of display memory 18. Effectively display memory 18, to which interactive access to decoder processor 17 is provided over leads 22, furnishes timing and deflection control to display unit 20 in a conventional manner.

DETAILED DESCRIPTION

Figure 2:
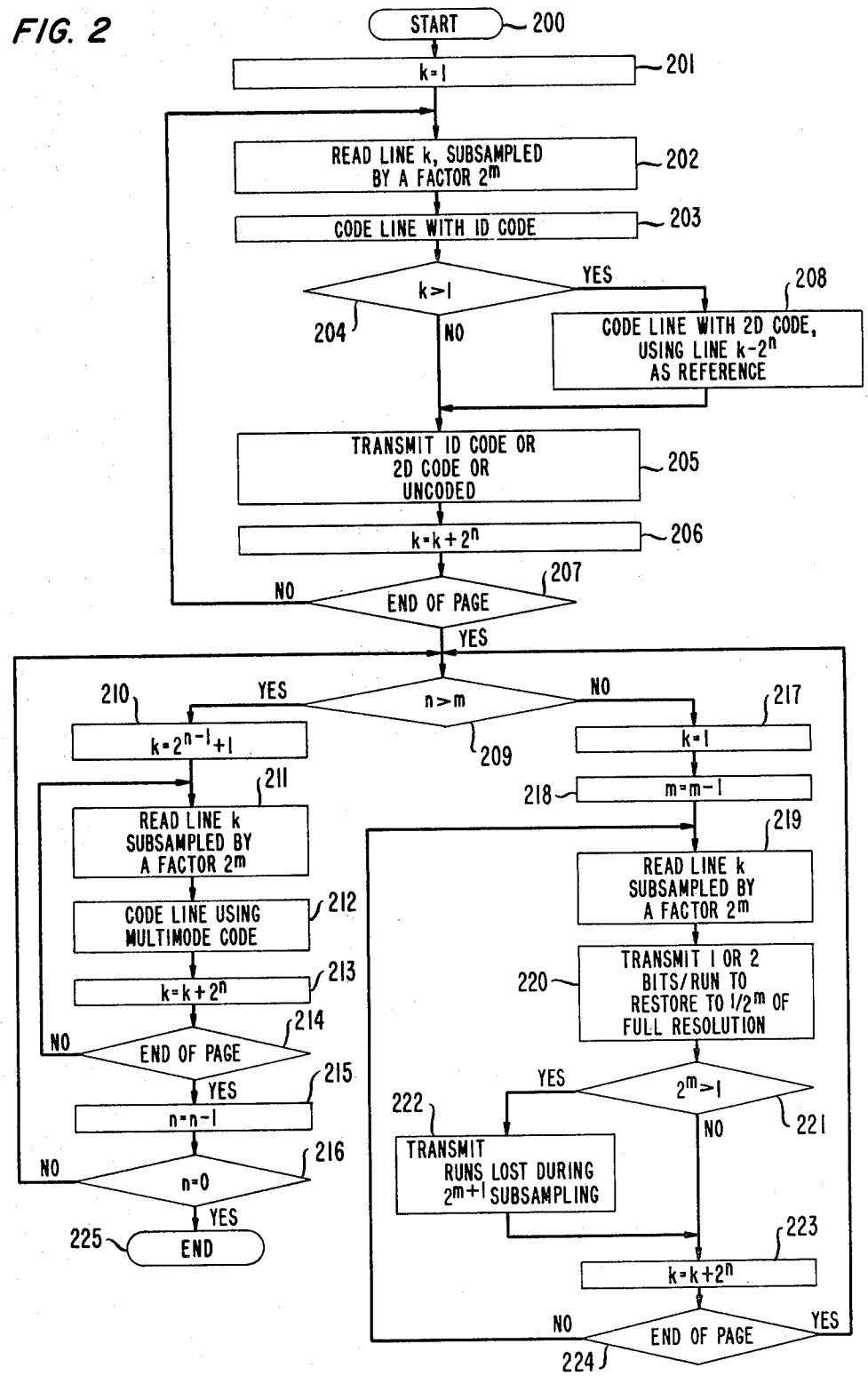
FIG. 2 shows a flow chart of the encoding of a picture to facilitate progressive transmission thereof.

With reference to FIG. 2, the disclosed method and apparatus for the transmission of two-tone pictures or images progressively in several stages is described in detail. Most of the picture information transmitted is coded using either of the previously referenced MHC or MRC codes.

The disclosed progressive transmission scheme make a compromise between the rapidity with which the first coarse version of the picture is obtained and the transmission time for the final accurate picture. The coarse information generated and transmitted during the early stages of the progressive transmission is a compressed approximation of the actual gel information. Information is normally approximated by either subsampling or by averaging or filtering. Using an averaging or a filtering method involves sending a grey tone or multi-level signal which represents the average tons of a group of pels. Such an averaging or a filtering method could be used when the disclosed invention is utilized for progressive transmission of multi-level pictures. In the subsampling method the actual binary signal information from one pel of a subsampling group of pels is used to represent the binary signal information from the whole subsampling group of pels. Thus, as utilized in the disclosed scheme the black or white (binary) tone of one pel is used to represent the tone of a group of two or four pels. The preferred embodiment of the disclosed scheme transmits only information which is necessary for the final picture and hence a subsampling method is utilized. It is to be noted that the disclosed progressive transmission scheme does not preclude the use of an averaging method for compressing data during the early stages of transmission.

The disclosed progressive transmission scheme is line based which means that binary line signal information is transmitted on a per line basis. In the preferred embodiment progressive transmission occurs in 8 stages, each stage consisting of information on preselected non-successive lines of the picture. However, the eighth stage includes data on a few isolated pels, typically 5 to 200 per document, which are different from the corresponding pels of the picture original. Therefore, stage 8 can in general be omitted without any significant impairment of the picture quality. FIG. 5 illustrates the typical progressive improvement of the resolution of the received picture or image after stages 1 through 7 using the disclosed scheme.

Figure 3:
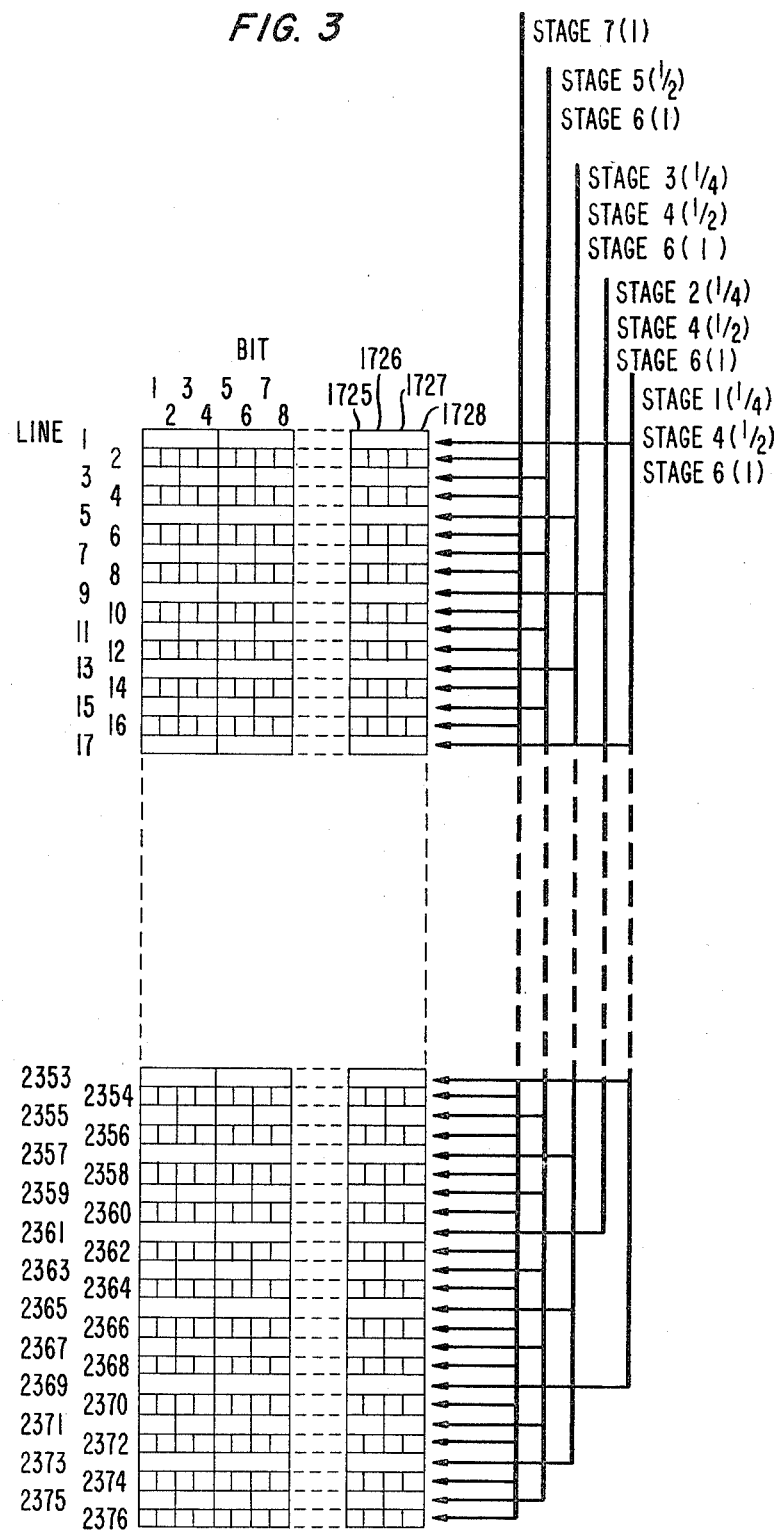
FIG. 3 shows the selection of picture elements of various lines of the picture during various stages the transmission.

Referring jointly to FIGS. 3 and 5, the order of transmission of the scanned lines of a typical picture is illustrated during each stage of the progressive transmission. As shown in FIG. 3, for a document having 2376 lines, during stage 1, 1 line of 16 is selected and transmitted at one-fourth horizontal resolution, (also referred to herein as a resolution of four pels). Hence, a binary line signal for lines 1, 17, 33, etc., up to line 2369 of the document is transmitted at one-fourth resolution in a coded format (described in a later paragraph). FIG. 5, line 1 illustrates the resulting resolution. As shown in FIG. 3, during stage 2, again 1 line of 16 is transmitted, starting at line 9 and continuing up to line 2361, at one-fourth resolution in a coded format. Therefore, a coarse version of every 8th line of the picture has been transmitted after stage 2 is completed. FIG. 5, line 2 shows the resulting resolution after stage 2 for a typical image transmission. As shown in FIG. 3, during stage 3, 1 line of 8 is transmitted (starting with line 5) at one-fourth horizontal resolution. Thus, after stage 3 every fourth line of the picture has been transmitted at one-fourth horizontal resolution. FIG. 5, line 3 shows the typical resolution obtained after stage 3. It is to be noted that stages 1, 2 and 3 could have been combined into one stage which transmits 1 of 4 lines at one-fourth horizontal resolution.

The horizontal resolution of the transmitted lines is doubled during stage 4. Thus, with reference to FIG. 3, the lines transmitted during stages 1, 2 and 3 are retransmitted with supplementary information (described in a later paragraph) which enables the resolution to be increased from one-fourth to one-half resolution. FIG. 5, line 4 shows the typical resolution obtained after stage 4. As shown in FIG. 3, during stage 5, 1 line of 4 is transmitted at one-half horizontal resolution. Thus, after stage 5 one line of every four lines has been transmitted at one-half horizontal resolutions. FIG. 5, line 5 demonstrates the resulting typical picture quality. The horizontal resolution of the previously transmitted lines is doubled in stage 6. Hence, referring to FIG. 3, the lines transmitted during stages 1, 2, 3, 4 and 5 are retransmitted with coded information which increases their resolution from one-half to full resolution. After stage 6 every odd line of the picture has been transmitted at full resolution and appears as shown in line 6 of FIG. 5.

During stage 7, the odd numbered lines of FIG. 3 are transmitted at full resolution. The resulting image of the transmitted picture appears as shown by line 7 of FIG. 5. The transmission of the picture is essentially complete after stage 7. However, as will be described later, the subsampling technique utilized to encode transmissions at less than full resolution results in a loss of some runs of length one (i.e. isolated pels). While the loss is not generally visible (typically 5 to 200 runs for a CCITT picture) a completely lossless transmission would require that these runs be transmitted during a stage 8 transmission. The additional time required for such a transmission is minimal adding about 0.5 percent of the total coding length. The insignificant improvement resulting after stage 8 is not illustrated in FIG. 5. It is to be noted that if required by the particular application the early stages of transmission could be combined together. Thus, referring to FIG. 5, the progressive transmission could begin at any stage from 1 through 6 without departing from the disclosed invention.

The above-described progressive transmission method is implemented by programming transmission processor 13 of FIG. 1 to implement the flow diagram of FIG. 2. The overall operation is interactive between frame memory 12 and transmission processor 13 of FIG. 1. Frame memory 12 has stored on a line basis the pels for the scanned image 10 of FIG. 1. Transmission processor 13 combines the full resolution pel in pairs (referred to herein as subsampling by 2) to form a one-half resolution picture on a line basis which is also stored in frame memory 12. The particular encoding method utilized will be described in a later paragraph. Transmission processor 13 combines the half-resolution elements in pairs (resulting in a overall subsampling of the pels by a factor of 4), using the same encoding method, to generate a one-fourth resolution picture on a line basis which is also stored in frame memory 12. It is to be noted that transmission processor 13 need not generate the reduced resolution picture prior to transmission but could generate it concurrently during the transmission process. The remaining sequence of events performed by transmission processor 13 to implement the progressive transmission method is more particularly described with reference to FIG. 2.

Returning to FIG. 2, the progressive transmission method is described for a stage 1 transmission having a vertical resolution of 1 line out of 16 (i.e. $2^n=16$, $n=4$ in FIG. 2) and a horizontal resolution of 1 pel out of 4 ($2^m=4$, $m=2$ in FIG. 2). While the preferred embodiment as disclosed herein utilizes $n=4$ and $m=2$, it is to be understood that the disclosed invention can be implemented with any integer value for m or n.

As shown in 201 of FIG. 2 the variable k, which denotes which line of the document (page, sheet, frame, etc.) is being transmitted, is set to one. By way of example, the following description assumes a document has 2376 lines with 1728 pels per line. Obviously, the disclosed invention can be utilized with documents having any number of lines and pels.

During step 202 transmission processor 13 reads line 1 from addressable frame memory 12. As previously described, frame memory 12 stores binary information of each pel in a manner which enables its access on a line-by-line basis by transmission processor 13. Once line 1 is read from frame memory 12, it is subsampled by a factor of 4 (i.e. $m=2$). The preferred subsampling technique will be described in a later paragraph. During step 203 the information for line 1 is generated in a 1D code for transmission. As previously described in the Hunter et al article the 1D code is a one-dimensional coding scheme in which run lengths are encoded in a modified Huffman code (MHC). Line 401 of FIG. 4 depicts the message format for a transmission using 1D coding.

In the 1D coding the scan line is regarded as a sequence of alternating black and white lines. All lines are assumd to begin with a white run to ensure that the receiver maintains color synchronization. If the first actual run on a line is black, then a white run of zero length is transmitted at the beginning of the line.

Separate code tables as shown in Table 1 of the Hunter et al article are used to represent the black and white runs. The coding for each black and white run is uniquely identifiable as is the end of line EOL codeword.

The disclosed message format shown in line 401 of FIG. 4 differs from the message format shown in FIG. 3 of the Hunter et al article in that mode bits preceed the coding of a scan line (data). The mode bits signal the receiver that the scan line is coded (b1=1) or uncoded (b1=0) and if coded whether the code is a 1D code (b2=0) or a 2D code (b2=1). After all the runs of a scan line are transmitted an EOL codeword signals the end of the scan line. The EOL codeword separates scan lines of the same stage of transmission. As shown in line 404 six EOL codewords separate each stage of transmission and seven EOL codewords and a post message signal the completion of the transmission of an image or page.

Returning to FIG. 2, in step 203, line 1 (k=1) is encoded in a 1D code. Since variable K is equal to 1 decision step 204 directs transmission processor 13 to perform the function of step 205. Step 205 instructs transmission processor 13 to transmit the generated line signal in either the uncoded form, the 1D code or the 2D code according to which one leads to the smallest coding length. Using the smallest coding length for a transmission ensures the shortest transmission time and hence an efficient progressive transmission method.

Since the first line transmitted does not have a previously transmitted reference line, the first line cannot be sent in a 2D code. Thus, for line 1 the choice is to send the line uncoded or in a 1D code. In the uncoded form a binary bit is sent for each pel of the scan line. When a picture is subsampled, (by a factor 4 for example), the uncoded version is often the most efficient even for text, because the runs are very short. Therefore, using an uncoded message format is incorporated as an option in the disclosed invention.

After line 1 is transmitted in step 205 the variable k, currently equal to 1, is indexed in step 206 to be $k+2^n$ or 17 (since $n=4$). If the new line number k is less than the maximum number of lines in a page (2376 for a one type of CCITT document or page) decision step 207 directs transmission processor 12 to do step 202 (i.e. read line 17, subsampled by 4). In step 203 transmission processor 12 encodes the line in a 1D code. Since k is greater than 1, decision step 204 directs transmission processor in step 208 to code the line in a 2D code.

In the Hunter et al article, previously incorporated by reference herein, a two dimensional coding scheme (2D) called the modified READ code is described in section VII on page 864. Basically, the 2D code is a line-by-line scheme in which the position of each changing element on the coding line is coded with respect to either the positions of a corresponding changing element on the reference line, which lies immediately above the coding line, or with respect to the preceeding changing element on the coding line. The 2D code is generated using the flow diagram of FIG. 7 and Table VIII of the Hunter et al article.

In the disclosed embodiment, shown in line 401 of FIG. 4, during stage 1 of the progressive transmissions (steps 202 through 208 of FIG. 2) the run length can be encoded in either a 1D or a 2D code or an uncoded format. As noted previously, the mode bits signal the receiver which code the transmitter utilized. Note, all lines transmitted in 2D code during stage 1 utilize the previously transmitted line as the reference line.

As shown in line 402 of FIG. 4 when a 2D is used during a stage 2 or stage 3 transmission the reference line bit specifies whether the reference line is above or below the coding line. If the reference line bit is zero the 8th line above is the reference line and if the bit is one the 8th line below is the reference line. The reference line selected is the reference line which results in the smallest amount of coding, thus assuring efficient operation. It is to be noted that another approach could utilize an interpolation of the 8th line above and the 8th line below as the reference line.

Returning to FIG. 2, during step 208 the coding line is encoded in a 2D code with the appropriate reference line bit selected. In step 205 the line is transmitted either uncoded or in the 1D code or the 2D code according to which one leads to the smallest coding length for the line. In step 206, k is indexed from 17 to 33 ($k+2^n$) and the loop sequence of steps 207, 202, 203, 204, 208, 205 and 206 is repeated. Finally, when k becomes 2385 it is past the end of page (2376 lines per page) and hence, transmission processor 12 in step 207 is directed to step 209.

Since in the preferred embodiment n is 4 and m is 2, decision step 209 is affirmative and step 210 is performed. In step 210, k is set equal to 9 (i.e. $2^{n-1}+1$). In steps 210 through 214 stage 2 of the progressive transmission occurs. As shown stage 2 transmission (transmitting every 16th line) continues until the end of the page is reached in step 214. In step 211, line 9 is read subsampled by a factor 4. In step 212, line 9 is coded in a multimode code which includes either a 2D code format using a reference line above or below the current line or an uncoded format. The 2D code is shown by line 402 of FIG. 4. For line 9, the reference line bit is selected according to the reference line, 8 lines above or below, which results in the smallest coding length (and hence transmission time). In step 213, k is indexed by 16 (i.e. $2^n$) and compared with the end of the page. Stage 2 continues through steps 211, 212, 213 and 214 until the end of the page is reached.

When the end of page is reached stage 2 ends and stage 3 begins with step 215. During step 215, n decremented by one to 3 and compared with zero in step 216. It is to be noted that in general integer n could be decremented in step 215, by an integer p which is greater than or equal to 1. Additionally, a step would be inserted after step 207 in which $n=n-(p-1)$. Such an arrangement would then skip some intermediate stages of the progressive transmission.

After step 216 is performed the decision step 209 is performed. Since $n=3$ and $m=2$ step 209 is followed by step 210. Step 210 starts with k set to 5 (i.e. $2^{n-1}+1$). As shown in FIG. 3, stage 3 transmits every 8th line starting with line 5. This is accomplished in FIG. 2 by repeating steps 211, 212, 213 and 214 until the end of page is reached. Note with reference to FIG. 4 the data format for stage 3 transmissions are the same as the previously described stage 2 transmissions.

Once the end of the page is reached the decision step 214 is performed. In step 215, the value of n is indexed to 2 and decision step 216 is performed. Since n is now 2 and m is 2 the statement $n>m$ of step 209 is no longer true. Hence, step 217 is performed.

Step 217 starts stage 4 of the progressive transmission. In step 217 the line number k is set to 1. In step 218 the value of m is indexed to $m-1$ or 1. As noted previously $2^m$ determines the subsample size. It is also to be noted that in general the subsample integer variable m can be decremented, in step 218, by integer 1 which is greater than or equal to 1. In such an arrangement horizontal resolution of the picture would then proceed more quickly to full resolution.

Returning to the disclosed arrangement, after step 218 $m=1$, and hence the subsample size is reduced to 2. Thus, with reference to FIG. 3, during stage 4, the horizontal resolution of the already transmitted lines of stages 1, 2 and 3 is doubled. Returning to FIG. 2 during step 219 line k (line 1) is read and subsampled by a factor of 2. With reference to FIG. 6, it is shown that 1 bit per run is usually sufficient to double the resolution of a line, since the end of a run is either left unchanged or is moved one pel to the right. For example, in FIG. 6, lines a., b. and c. show that 1 bit per run is usually sufficient to double the resolution of line b. to line c., since the end of a run is either left unchanged (b1, b2) or is moved one pel to the right (w2, b4).

As will be described later, a special subsampling is utilized to minimize the number of runs of length one which are deleted by subsampling (such as run b3 of line a. which is deleted during subsampling). Therefore, when double the resolution, it is also necessary to include a particular code to indicate the end of a run which has length one at low resolution.

This is illustrated in FIG. 7. FIG. 7 shows five different types of black runs leading to a black run of length one at half resolution. In line a. of FIG. 7 the pels of the original line are shown. Line b. of FIG. 7 shows the original line at half resolution. FIG. 7 shows that runs of length one at half resolution (e.g. b3, b4, b5 of line b.) can be formed by various arrangements of runs of lengths 1, 2 or 3 (e.g. b3, b4, b5 of line a.) at full resolution. Similarly, in line c., the runs of length one at one-fourth resolution can be formed from runs of length 1, 2 or 3 at half resolution. The coding utilized to double the resolution of a prior line compares the position of the end of a prior run of the half-resolution line b. with the full-resolution line a. to determine the data transmitted. When the position of the end of the prior run in line b. is moved to the right in line a. (e.g. w1, w2, b2, b5) there are only two possibilities for the end of the run, therefore, one bit can be used to code such runs. Recited in line d. of FIG. 7 is the code utilized to encode runs where the position of the end of the prior run moved to the right. The code 0 indicates that there is no shift in the end of the current run (e.g. b1, w3, w6). The code 1 indicates that there is a shift by one pel to the right by the end of the current run (e.g. b2). Using this data the receiver changes a previously received half-resolution line b. into a full-resolution line a. by shifting or not shifting the end of each run. When the position of the end of the prior run did not move to the right (e.g. b1, w3, w4, b4, b5, w6), there are now three possible lengths of the runs of the current run. Recited in line e of FIG. 7 is the code utilized to encode such runs. The code 0 indicates that there is no shift in the end of the current run (e.g. w4, b4, w5). The code 10 indicates that there is a shift by one pel to the left by the end of the run (e.g. b3). The code 11 indicates that there is a shift by one pel to the right by the end of the run (e.g. w1, w2, b5).

Line 403 of FIG. 4 illustrates the format for line data transmitted during stage 4. Since most of the run data transmitted during stage 4 is only 1 bit or 2 bits long, stage 4 transmission time is not as long as that for prior stages despite the fact that data for 1 of 4 lines are transmitted.

Returning to FIG. 2, the above transmissions of stage 4 occur during step 220. In step 221 since $m=1$, $2^m > 1$ and step 222 requires that the lost runs of length one be transmitted. As previously noted, in discussion of FIG. 6, a few runs of length one are suppressed in stages 1, 2 and 3. The suppressed runs which have a length of one pel at half resolution must be restored because, as shown by b5 line a. of FIG. 7, they have, at full horizontal resolution, a length of up to 3 pels. The horizontal coordinate of the lost or suppressed runs (or pels since they have a length of one) are transmitted uncoded except that the last bit is deleted since it can be shown that the suppressed pels have always an even coordinate. For the CCITT facsimile documents, since at half resolution they have 864 pels per line (10 bit coordinate), 9 bits are required for addresses. For the vertical coordinate, one bit is used to indicate whether the suppressed run is on the same line as the previous suppressed run. If it is not the case, a second bit is used to indicate whether or not the suppressed run is on the line following the last suppressed run. If not, the vertical coordinate is transmitted uncoded (10 bits).

At the completion of step 222 the line k is indexed, in step 223, to $k+2^n$ or 5. Since line 5 is still within the page boundary, step 224 returns control to step 219, and stage 4 transmission continue through steps 219, 220, 221, 222, 223 and 224 until the end of page is reached. When the end of page is reached, step 224 returns control to step 209 and stage 4 terminates and stage 5 begins. As noted previously after stage 4, the image, picture, or facsimile has been restored to half resolution with 1 line of 4 transmitted. The typical resolution after stage 4 is shown by 4 of FIG. 5.

With reference to FIG. 4 the coding of stage 5 is similar to stages 2 and 3, except that the coding is twice as long. Returning to FIG. 2 since $n=2$ and $m=1$, at the conclusion of stage 4 step 209 transfers control to step 210 and line 3 becomes the first line transmitted during stage 5. FIG. 3 illustrates the format of the lines transmitted during stage 5. In a manner similar to that previously discussed for stage 2, line transmission occurs during stage 5 by cycling through steps 211, 212, 213 and 214 until an end of page is reached in step 214. When the end of a page is reached, stage 5 is completed and n is decrement to 1 in step 215. In step 216 control is returned to step 209. Typical resolution after stage 5 is shown by 5 of FIG. 5.

In stage 6, since $n=1$ and $m=1$, step 209 transfers control to step 217. The coding of stage 6 is similar to stage 4 except that it is now not necessary to restore the suppressed runs because there are only very few of them and they have a length of one pel. Stage 6 transmissions start at line 1 (step 217) and have full resolution since $m=0$ (step 218). During stage 6 every other line is restored to full resolution using the message format of stage 4 (see FIG. 4). Stage 6 cycles through steps 219, 220, 221, 222, 223 and 224, in the manner as described for stage 4, until the end of page is reached. When the end of page is reached control is transferred from step 224 to step 209 and stage 6 is completed and stage 7 begins. Typical resolution after stage 6 is shown by 6 of FIG. 5.

Stage 7 begins when $n=1$, $m=0$ cause control from step 209 to be transferred to step 210. The transmission during stage 7 begins at line 2 and includes all the even lines (see FIG. 3). Stage 7 is similar to stage 5 except that the lines being coded have full horizontal resolution. Transmission of lines during stage 7 occur by cycling through steps 211, 212, 213, 214 as previously described for stages 5 and 2. When an end of page is reached in step 214, n is decremented to 0 in step 215, step 216 transfers control to end the transmission (step 225). Referring to line 404 of FIG. 4 the end of the transmission of the image, picture, or facsimile is depicted by the seven EOL code words followed by the post message.

The typical resolution after stage 7 is shown on by 7 of FIG. 5. The image is practically identical to the original. As noted earlier, and as will be elaborated on in a later paragraph, some runs of length one (5 to 200 for a typical image) have been suppressed during the encoding. The loss is not generally visible. A stage 8 transmission which would include the address location of the missing pels could be added if lossless transmission is required. Such a stage 8 would add little to the total coding time (about 0.5 percent). Alternatively, the missing pels could have been coded into stage 6 in which case step 222 of FIG. 2 would be mandatory after step 221.

The disclosed progressive transmission method and apparatus permits crude versions of a image to be obtained in a small fraction of the total transmission time. Progressive transmission using the disclosed invention requires a total time about 20 percent higher than the nonprogressive transmission time. As shown in stage 5 of FIG. 5, however, practically every detail of the image is legible despite the fact that only approximately 50 percent of the normal total transmission time has elapsed. Thus, in certain video or facsimile applications there is no need for the remainder of the remaining stages of the transmission.

Subsampling

As described above the disclosed method and circuitry progressively transmits black and white images in stages. As previously noted, when a multi-level picture is to be transmitted subsampling would not be utilized. Instead, standard averaging or filtering techniques could be utilized to compress the information for progressive transmission. For example, see the previously referenced Knowlton patent.

As noted, the disclosed progressive black and white image transmission method uses a horizontal subsampling of four in stages 1, 2 and 3 and subsampling of two in stages 4 and 5. By using a conventional subsampling method (taking one sample out of two or four pels), many short runs would be suppressed. Therefore, a special subsampling method is disclosed for two to one subsampling of the lines. While with the conventional subsampling, about half the runs of length one would disappear, the disclosed subsampling loses or suppresses only about half the runs of length one which follows a run of length one. Therefore, in a typical image transmission only 5 to 200 runs of length one are suppressed.

With reference to FIG. 6, line a. shows a typical original line at full resolution. Line b. shows the new line obtained by subsampling by a factor of two. The subsampling process determines from the color (tone) of two successive pels on a line the color (tone) of the single pel replacement. If both pels are the same color (either black or white) the same color is selected for the single pel. Thus, the pairs 1, 3, 4 and 8 of black pels of line a. result in the low resolution black pels 1, 3, 4 and 8. Similarly, the pair of white pels 6 results in the low resolution white pel 6 in line b. If the two pel are of opposite color, the pel at low resolution is given the color opposite that of the previous low resolution pel. Thence, in line a. pel pairs 2, 5, 7 and 9 become pels 2, 5, 7 and 9 at low resolution in line b. having a color opposite the color of the preceeding pels 1, 4, 6 and 8 respectively.

Note, that the black run b3 is suppressed during the subsampling. Using the previously described progressive transmission method line b. would be restored to appear as line c. at the receiver location. Thus, line c. is identical to line a. except for the last black run b3. As noted previously a lost run of length one can be transmitted separately and incorporated into line c. at the receiver.

When a subsampling by a factor of 4 is utilized, as in stages 1, 2 and 3, it is obtained by twice subsampling by two. It is to be noted that the disclosed subsampling method is repeated m times to obtain subsampling by a factor of $2^m$. Additionally, the disclosed subsampling method can be generalized to subsample by an arbitrary factor.

Receiver Location Operation

With reference to FIG. 1, at the receiver location decoder processor 17 includes a microprocessor, minicomputer, etc. which is programmed to decode the received data transmission in a manner which is essentially the reverse of the coding method flow chart of FIG. 2. Decoder processor 17 interacts with display memory 18 over leads 20 to reconstruct the transmitted image for display by display unit 19.

Decoder processor 17 decodes and causes said display memory 18 to store the received binary line signal of each $2^n$th line of a scanned image and then decodes and causes said display memory to store the received binary line signal of additional lines until each $2^m$th line of said scanned image is stored. Thereafter decoder processor 17 decodes and reconstructs interactively with the display memory 18 each of the $2^m$th previously received lines into a progressively fine horizontal resolution and additionally decodes and causes the display memory to store the received binary signal of each additional line received from said transmitting terminal resulting in a progressively finer vertical resolution of image. The decoding and reconstructing method continues until the transmission is either stopped or continued until each line of the scanned image is received at full horizontal resolution.

After the first stage, most lines are not available at the receiver location for display. It might therefore be useful for the decoder processor 17 to approximate them by interpolation. It is often not necessary to make the interpolation because the human eye is a much better interpolator than any mathematical interpolation. The interpolation power of the eye is, however, limited when the viewing distance is short. Therefore, a limited amount of interpolation is added to improve the image quality of the first few stages. For example an interpolated line can be inserted between two transmitted lines. A straightforward linear interpolator means can be used to form the interpolated lines. Additionally, improved image quality results when the interpolation between the runs of two lines exists only if those two runs have at least one pel in the same column.

Furthermore, improved image quality during the early stage can occur if decoder processor 17 thicken the lines of both the received and the interpolated lines. For example, circuit means can enable each received line to be duplicated as an adjacent line, effectively doubling the thickness of the displayed lines. Thus, during stages 1, 2 and 3 each line can be doubled for display purposes.

Other Applications

The disclosed progressive transmission method and apparatus can be utilized with all picture transmission systems which utilize line-by-line coding. For example, a dither coded picture can be rearranged and then transmitted in a line-by-line code and therefore can also be progressively transmitted using the disclosed invention. Such a dither coded picture rearranging technique is described in the article entitled "An Extension of the CCITT Facsimile Codes for Dithered Pictures" by O. Johnson and A. N. Netravali in *The Bell System Technical Journal*, Vol. 60, No. 3, March 1981, pp. 391-404.

As a further example, the disclosed invention can be applied to multi-tone picture which are transmitted in bit planes. In such an application the bit planes are encoded in a line-by-line code and therefore, can also be progressively transmitted using the disclosed invention. For example, see the article "Source Coding of X-ray Pictures", by M. Kunt, *IEEE Trans. Biomed. Eng.*, Vol. BME-25, March 1978, pp. 121-138.

The specific embodiment described in the text is illustrative of the invention; those skilled in the art will appreciate that alternate embodiments and modifications to the method and circuitry disclosed are possible without deviation from the scope of the appended claims.

What is claimed is:

1. A method for transmitting signals representing picture elements (pels) of a line scanned picture, the method CHARACTERIZED BY the steps of:
    transmitting signals which define each $2^n$th line of said line scanned picture, where n is an integer greater than one, and wherein each transmitted signal has a horizontal resolution of $2^m$ pels, where m is an integer greater than zero and less than or equal to n; and
    progressively increasing the vertical resolution of the picture defined in the prior step by transmitting signals having a horizontal resolution of $2^m$ pels which define additional lines including each $2^{n-p}$th line of said line scanned picture, where p is an integer greater than zero and less than n.

2. The method of claim 1 further including the step of:
    transmitting a supplementary signal to increase the horizontal resolution of at least one of the previously transmitted lines to a horizontal resolution of $2^{m-1}$ pels where 1 is an integer greater than zero and less than m.

3. The method of claim 1 wherein said transmitting signals are derived by the steps of:
    generating two or more separately identifiable signal representations of each line of said scanned picture being transmitted, and
    transmitting one of the two or more separately identifiable signal representations such that the signal transmission time is minimized.

4. The method of claims 1, or 3 wherein each of said transmitted signals includes
    data bits representing the picture tone of picture elements of each transmitted line of said scanned picture and
    a control bit for specifying the format of said data bit.

5. The invention of claim 4 wherein
    said data bit is encoded and
    said control bit specifies the code format of said data bits.

6. The invention of claim 4 wherein said data bits are a difference signal between a signal of a reference line and the signal of the line presently being transmitted and said control bit specifies a signal of a previously transmitted line to be used as a reference signal for the signal of the line presently being transmitted.

7. The invention of claim 4 wherein said control bit specifies as a reference signal the nearest line above or the nearest line below the position of the line presently being transmitted.

8. The invention of claim 4 wherein said reference signal is an interpolation of signals of previously transmitted lines above and below the line presently being transmitted.

9. The invention of claim 4 wherein said data bit is encoded in a run length format.

10. The invention of claim 4 wherein said control bit specifies a ID format or a 2D format of a CCITT code into which the data bits are encoded.

11. The method of claims 1, or 3 where the pels of each scanned line of the picture have two possible tones and is represented by a binary signal.

12. The method of claim 11 where the transmitted signals which defines lines of said scanned picture are generated from the binary signals of pels of the lines by the step of:
    determining a binary signal representing a tone of a group of two or more pels of a line by selecting the binary signal of one of the elements of said group.

13. The method of claim 11 where the transmitted signals which defines lines of said scanned picture are generated from the binary signals of pels of the lines by the steps of:
    determining a binary signal representing the tone of a first group of two or more pels in each group of two or more pels of a line by
    selecting the binary signal of said first group to be the same binary signal as said first group when all the pels in said first group are the same tone and
    selecting the binary signal of said first group to be opposite the binary signal of a previously determined adjacent group of pels when the binary signal of each element of said first group are different.

14. The method of claim 11 where the transmitted signals which defines lines of said scanned picture are generated from the binary signals of pels of the lines by the step of:
    determining a binary signal representing a tone of a group of $2^m$ pels of a line by selecting the binary signal of one of the elements of said group of $2^m$ pels.

15. The method of claim 11 where the transmitted signals which define lines of said scanned picture are generated from the binary signals of pels of the lines by the steps of:
    determining a binary signal representing the tone of a pair of pels in each group of $2^m$ pels of a line by
    selecting said binary signal to be the same as the binary signal as said pair when both pels in said pair are the same tone and
    selecting said binary signal to be opposite the binary signal of a previously determined adjacent pair of pels when the tone of each element of said pair are different.

16. The method of claim 15 wherein $m \geq 2$ and said steps of claim 15 are sequentially repeated m times.

17. The method of claim 1, wherein the transmitted signals are selected from two or more separately identifiable signals of each line of said scanned picture, said selection being determined by which of said two or more separately identifiable signals would minimize the transmission time.

18. A method for transmitting signals representing picture elements (pels) of a line scanned picture, the method CHARACTERIZED BY the steps of:
    transmitting signals which define each $2^n$th line of said line scanned picture at a horizontal resolution of $2^m$ pels, where n is an integer greater than zero and m is an integer greater than zero and less than n;
    transmitting supplementary signals to increase the horizontal resolution of the previously transmitted lines to a horizontal resolution of $2^{m-1}$ pels, where l is an integer greater than zero and less than m; and progressively increasing the vertical resolution of the picture defined in the prior steps by transmitting signals which define additional lines including each $2^{n-p}$th line of said line scanned picture, where p is an integer greater than zero and less than n.

19. A method for receiving signals representing picture elements (pels) of a line scanned picture, the method CHARACTERIZED BY the steps of:

receiving signals which define each $2^n$th line of said line scanned picture, where n is an integer greater than one, and wherein each received signal has a horizontal resolution of $2^m$ pels, where m is an integer greater than zero and less than or equal to n; and progressively increasing the vertical resolution of the picture defined in the prior step by receiving signals having a horizontal resolution of $2^m$ pels which define additional lines including each $2^{n-p}$th line of said line scanned picture, where p is an integer greater than zero and less than n.

20. The method of claim 19 further including the step of:

receiving a supplementary signal to increase the horizontal resolution of at least one of the previously received lines to a horizontal resolution of $2^{m-l}$ pels where l is an integer greater than zero and less than m.

21. The method of claim 19 including the step of:

decoding a received signal representing one of the two or more separately identifiable signal representations of each line of said scanned picture.

22. The method of claim 19, further including the step of:

linearly interpolating between two received signals of two received lines to generate a signal of a line of said scanned picture not yet received.

23. The method of claim 22 wherein said linearly interpolating step further including the step of:

linearly interpolating an unreceived line between two received lines by interpolating a group of pels on the unreceived line only when a group of pels exists on each of said two received lines and have at least one pel in each group which occupy the same vertical column.

24. A method for receiving signals representing picture elements (pels) of a line scanned picture, the method CHARACTERIZED BY the steps of:

receiving signals which define each $2^n$th line of said line scanned picture at a horizontal resolution of $2^m$ pels, where n is an integer greater than zero and m is an integer greater than zero and less than n;

receiving supplementary signals to increase the horizontal resolution of the previously received lines to a horizontal resolution of $2^{m-l}$ pels, where l is an integer greater than zero and less than m; and progressively increasing the vertical resolution of the picture defined in the prior steps by receiving signals which define additional lines including each $2^{n-p}$th line of said line scanned picture, where p is an integer greater than zero and less than n.

25. A method for transmitting signals representing picture elements (pels) of a line scanned picture, the method CHARACTERIZED BY the steps of:

transmitting at a resolution of four pels a first signal representing sequentially every 4th line of said scanned picture, transmitting a second signal to increase the resolution of every previously transmitted line of said scanned picture from four pels to two pels, and transmitting at a resolution of two pels a third signal representing sequentially each line of said scanned picture located two lines away from the previously transmitted lines.

26. The method of claim 25 further including the steps of:

transmitting a fourth signal to increase the resolution of every previously transmitted line of said scanned picture from two pels to one pel, and transmitting at a resolution of one pel a fifth signal representing sequentially each of the remaining lines of said scanned picture.

27. The method of claim 25 wherein the step of generating a first signal includes the steps of:

transmitting at a resolution of four pels a signal representing sequentially every 16th line of said scanned picture, transmitting at a resolution of four pels a signal representing sequentially each line of said scanned picture located eight lines away from the previously transmitted lines, and transmitting at a resolution of four pels a signal representing sequentially each line of said scanned picture located four lines away from the previously transmitted lines.

28. A method for receiving signals representing picture elements (pels) of a line scanned picture, the method CHARACTERIZED BY the steps of:

decoding each received first signal as every 4th line of said scanned picture at a resolution of 4 pels, decoding each received second signal to increase the resolution of every previously received line of said scanned picture from 4 pels to 2 pels, and decoding each received third signal as a line located two lines away from the previously transmitted lines at a resolution of 2 pels.

29. The method of claim 28 further including the steps of decoding each received fourth signal to increase the resolution of every previously received line of said scanned picture from 2 pels to 1 pel, and decoding each received fifth signal as representing sequentially each of the remaining lines of said scanned picture at a resolution of 1 pel.

30. Apparatus for transmitting signals representing picture elements (pels) of a line scanned picture CHARACTERIZED IN THAT said apparatus includes first means for transmitting signals which define each $2^n$th line of said line scanned picture, where n is an integer greater than one, and wherein each transmitted signal has a horizontal resolution of $2^m$ pels, where m is an integer greater than zero and less than or equal to n; and second means for transmitting signals having a horizontal resolution of $2^m$ pels which define additional lines including each $2^{n-p}$th line of said line scanned picture, where p is an integer greater than zero and less than n.

31. The apparatus of claim 30 further including third means for transmitting a supplementary signal to increase the horizontal resolution of at least one of the previously transmitted lines to a horizontal resolution of $2^{m-l}$ pels where l is an integer greater than zero and less than m.

32. The apparatus of claim 30 including
means for generating two or more separately identifiable signal representations of each line of said scanned picture to be transmitted, and
means for transmitting one of said two or more separately identifiable signal representations such that the transmission time is minimized.

33. The apparatus of claims 30 or 32 wherein the pels of each scanned line of the picture have two possible tones and is represented by a binary signal and where the transmitted signals which define lines of said scanned picture are generated from the binary signals of pels of the lines, said apparatus further including
means for determining a binary signal representing the tone of a pair of picture elements (pels) in each group of $2^m$ picture elements by
selecting the binary signal of said pair to be the same binary signal as said pair when both pels in said pair are the same tone, and
selecting the binary signal of said pair to be opposite the binary signal of a previously determined adjacent pair of pels when the tone of each element of said pair are different.

34. The apparatus of claim 33 wherein $m \geq 2$ and said determining means repeats the operation of claim 33 sequentially m times.

35. The invention of claim 30 wherein said apparatus further includes
means for selecting a signal for transmission from two or more sequentially identifiable signals of each line of the scanned picture, said selecting means selecting a signal which minimizes the transmission time.

36. Apparatus for transmitting signals representing picture elements (pels) of a line scanned picture, the method CHARACTERIZED BY the steps of:
first means for transmitting signals which define each $2^n$th line of said line scanned picture at a horizontal resolution of $2^m$ pels, where n is an integer greater than zero and m is an integer greater than zero and less than or equal to n;
second means for transmitting supplementary signals to increase the horizontal resolution the previously transmitted lines to a horizontal resolution of $2^{m-1}$ pels, where l is an integer greater than zero and less than m; and
third means for transmitting signals which define additional lines including each $2^{n-p}$th line of said line scanned picture, where p is an integer greater than zero and less than n.

37. Apparatus for receiving signals representing picture elements (pels) of a line scanned picture,
CHARACTERIZED IN THAT
said apparatus includes
first means for receiving signals which define each $2^n$th line of said line scanned picture, where n is an integer greater than one, and wherein each received signal has a horizontal resolution of $2^m$ pels, where m is an integer between zero and less than or equal to n; and
second means for receiving signals having a horizontal resolution of $2^m$ pels which define additional lines including each $2^{n-p}$th line of said line scanned picture, where p is an integer greater than zero and less than n.

38. The apparatus of claim 37 further including
third means for receiving a supplementary signal to increase the horizontal resolution of at least one of the previously transmitted lines to a horizontal resolution of $2^{m-1}$ pels where l is an integer greater than zero and less than m.

39. The apparatus of claim 37 including
means for decoding a received signal representing one of the two or more separately identifiable signal representations of each line of said scanned picture.

40. The invention of claims 37 or 39 wherein said apparatus further includes
means for linearly interpolating between two received signals of two received lines to generate a signal of a line of said scanned picture not yet received from said transmitting terminal.

41. Apparatus for receiving signals representing picture elements (pels) of a line scanned picture, the method CHARACTERIZED BY the steps of:
first means for receiving signals which define each $2^n$th line of said line scanned picture at a horizontal resolution of $2^m$ pels, where n is an integer greater than zero and m is an integer greater than zero and less than n;
second means for receiving supplementary signals to increase the horizontal resolution of the previously received lines to a horizontal resolution of $2^{m-1}$ pels, where l is an integer greater than zero and less than m; and
third means for receiving signals which define additional lines including each $2^{n-p}$th line of said line scanned picture, where p is an integer greater than zero and less than n.

42. Apparatus for transmitting signals representing picture elements (pels) of a line scanned picture
CHARACTERIZED IN THAT
said apparatus includes
means for transmitting at a resolution of four pels a first signal representing sequentially every 4th line of said scanned picture,
means for transmitting a second signal to increase the resolution of every previously transmitted line of said scanned picture from four pels to two pels, and
means for transmitting at a resolution of two pels a third signal representing sequentially each line of said scanned picture located two lines away from the previously transmitted lines.

43. The apparatus of claim 42 further including
means for transmitting a fourth signal to increase the resolution of every previously transmitted line of said scanned picture from two pels to one pel, and
means for transmitting at a resolution of one pel a fifth signal representing sequentially each of the remaining lines of said scanned picture.

44. Apparatus for receiving signals representing picture elements (pels) of a line scanned picture
CHARACTERIZED IN THAT
said apparatus includes
means for decoding each received first binary line signal as every 4th line of said scanned picture at a resolution of 4 pels,
means for decoding each received second binary line signal to increase the resolution of every previously received line of said scanned picture from 4 pels to 2 pels, and
means for decoding each received third binary line signal as a line located two lines away from the previously transmitted lines at a resolution of 2 pels.

45. The apparatus of claim 44 further including means for decoding each received fourth binary line signal to increase the resolution of every previously received line of said scanned picture from 2 pels to 1 pel, and means for decoding each received fifth binary line signal as representing sequentially each of the remaining lines of said scanned picture at a resolution of 1 pel.

* * * * *